(12) United States Patent
Che et al.

(10) Patent No.: US 11,721,566 B2
(45) Date of Patent: Aug. 8, 2023

(54) SENSOR ASSEMBLY AND METHODS OF VAPOR MONITORING IN PROCESS CHAMBERS

(71) Applicant: Applied Materials, Inc., Santa Clara, CA (US)

(72) Inventors: Xiaozhou Che, Sunnyvale, CA (US); Graeme Jamieson Scott, Sunnyvale, CA (US); Richard Gustav Hagborg, Felton, CA (US); Alan H. Ouye, San Mateo, CA (US); Nelson A. Yee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 43 days.

(21) Appl. No.: 17/374,189

(22) Filed: Jul. 13, 2021

(65) Prior Publication Data
US 2023/0018891 A1    Jan. 19, 2023

(51) Int. Cl.
| | |
|---|---|
| *H01L 21/67* | (2006.01) |
| *C23C 14/54* | (2006.01) |
| *C23C 16/455* | (2006.01) |
| *G01B 17/02* | (2006.01) |
| *H01L 21/66* | (2006.01) |
| *C23C 14/04* | (2006.01) |
| *C23C 14/12* | (2006.01) |

(52) U.S. Cl.
CPC ...... *H01L 21/67253* (2013.01); *C23C 14/546* (2013.01); *C23C 16/45565* (2013.01); *G01B 17/025* (2013.01); *H01L 21/6719* (2013.01); *H01L 22/12* (2013.01); *C23C 14/042* (2013.01); *C23C 14/12* (2013.01)

(58) Field of Classification Search
CPC ............ C23C 14/546; C23C 16/45565; G01B 17/025; H01L 21/67253; H01L 22/12
See application file for complete search history.

(56) References Cited

U.S. PATENT DOCUMENTS

| | | | | |
|---|---|---|---|---|
| 6,352,081 B1 * | 3/2002 | Lu | ...................... | H01L 21/67028 |
| | | | | 134/1.1 |
| 7,605,083 B2 * | 10/2009 | Lai | .................... | H01L 21/28556 |
| | | | | 117/88 |

(Continued)

FOREIGN PATENT DOCUMENTS

| | | | | | |
|---|---|---|---|---|---|
| JP | 2014070969 | | 4/2014 | | |
| KR | 20020024568 A | * | 3/2002 | ............. | H01L 21/68 |
| KR | 101340425 B1 | | 12/2013 | | |

OTHER PUBLICATIONS

International Search Report and Written Opinion for Application No. PCT/US2022/034095.

*Primary Examiner* — David L Singer
(74) *Attorney, Agent, or Firm* — Patterson + Sheridan, LLP

(57) ABSTRACT

Methods and systems for monitoring film thickness using a sensor assembly include a process chamber having a chamber body, a substrate support disposed in the chamber body, a lid disposed over the chamber body, and a sensor assembly coupled to the chamber body at a lower portion of the sensor assembly. The sensor assembly is coupled to the lid at an upper portion of the sensor assembly. The sensor assembly includes one or more apertures disposed through one or more sides of the sensor assembly, and the one or more sensors are disposed in the sensor assembly through the one or more of the apertures.

18 Claims, 6 Drawing Sheets

(56) References Cited

U.S. PATENT DOCUMENTS

| | | | |
|---|---|---|---|
| 2003/0127043 A1* | 7/2003 | Lu | H01L 21/28562 |
| | | | 257/E21.171 |
| 2013/0043235 A1 | 2/2013 | Sorabji et al. | |
| 2017/0213710 A1* | 7/2017 | Vladimir | H01J 37/32972 |
| 2017/0350688 A1 | 12/2017 | Boyd, Jr. et al. | |
| 2018/0080124 A1* | 3/2018 | Bajaj | H01J 37/32449 |
| 2019/0057889 A1* | 2/2019 | Mao | C23C 14/543 |
| 2019/0164731 A1 | 5/2019 | Vladimir et al. | |
| 2019/0382890 A1* | 12/2019 | Lerner | C23C 16/303 |
| 2020/0189874 A1* | 6/2020 | Ishikawa | C23C 14/14 |
| 2020/0357669 A1* | 11/2020 | Mao | H01L 21/6719 |

* cited by examiner

SENSOR ASSEMBLY AND METHODS OF VAPOR MONITORING IN PROCESS CHAMBERS

BACKGROUND

Field

Embodiments of the present disclosure generally relate to methods and systems for monitoring film thickness for multi-material deposition control using a sensor assembly.

Description of the Related Art

Organic vapor deposition is becoming increasingly relevant in building semiconductor devices and other optical devices. Vapor deposition processes generally include heating materials that are maintained at a desired pressure to a desired temperature such that the heated material is vaporized and then allowed to be transferred to a substrate where the vaporized material condenses onto a surface of the substrate. Organic vapor deposition is often used to form CMOS image sensors. However, organic vapor deposition can also be used to form organic light emitting diodes (OLEDs) organic photodetectors, solar cells, and other similar devices. These devices are used in the manufacture of television screens, computer monitors, mobile phones, and other hand-held devices for displaying information. The range of colors, brightness, and viewing angles possible with OLED displays are greater than that of traditional LED displays because OLED pixels directly emit light and do not require a back light, and thus lesson the energy consumption of the formed device. Further, OLEDs can be manufactured onto flexible substrates, resulting in further device applications as well.

Although these devices are useful, there are many challenges encountered in their manufacture. To fabricate film stacks for devices with high efficiency, the co-deposition of materials is often desired. When co-depositing materials onto a substrate, the placement of the materials on the surface of the substrate is important to assure that the resulting film layer(s) on the substrate are able to form a functioning device. Without the control of the placement of the materials, the resulting deposited materials within a formed layer may form undesirable domain sizes and morphologies that impedes charge separation and extraction in organic electronic devices. In some device configurations, it is desirable to deposit the materials onto a substrate such that multiple materials mix within a single formed layer or the multiple materials form a superlattice structure. However, conventional vapor deposition processes are not able to reliably form these types of multiple material containing layers, or composite layers without monitoring the vapor deposition using sensors. Chambers with sensors typically have extended down time to manage maintenance of sensors.

Accordingly, there is a need for methods and apparatus for managing film deposition rate and thickness while forming films on a substrate with multiple materials.

SUMMARY

In some embodiments, a process chamber is provided including a chamber body, a substrate support disposed in the chamber body, a lid disposed over the chamber body, and a sensor assembly coupled to the chamber body at a lower portion of the sensor assembly. The sensor assembly is coupled to the lid at an upper portion of the sensor assembly. The sensor assembly further includes one or more apertures disposed through one or more sides of the sensor assembly. One or more sensors are disposed in the sensor assembly through the one or more of the apertures.

In some embodiments, a method for processing a substrate is provided including exposing a first substrate to a first set of vapors within a process chamber while monitoring at least one attribute of the first set of vapors with a first sensor disposed in a sensor assembly. The sensor assembly is disposed between a lid and chamber body and circumscribing a showerhead. The method includes removing the first substrate from the process chamber and replacing the first sensor with a second sensor without opening the lid of the process chamber. A second substrate is exposed to a second set of vapors within the process chamber while monitoring at least one attribute of the second set of vapors with the second sensor disposed in the sensor assembly.

In some embodiments a sensor assembly is provided including an adaptor having a first major surface and a second major surface opposing the first major surface. A shroud is disposed within the adaptor. The shroud includes a shelf and an inner surface extending from a top of the shelf to the first major surface, the shelf and the inner surface forming a recess. A side extends from the first major surface to the second major surface of the adaptor. The side includes one or more apertures disposed therethrough, each aperture aligned with an aperture disposed through the inner surface of the shroud and configured to receive a sensor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments of the present disclosure generally relate to apparatuses and methods for forming substrates in one or more deposition processes. In embodiments described herein, a process system includes the same or different evaporable materials that are each contained in separate ampoules. Each evaporable material flows into a separate portion of a showerhead contained within a process chamber via a gas line. One or more sensors are positioned below the showerhead, such as a sensor below each portion of the showerhead. From the showerhead, each material is directed past a sensor onto a substrate that sits on the surface of a rotating substrate support. Controlling process parameters of the process system while the materials flow from the ampoules to the substrate can result in multiple materials mixed within a single formed layer or multiple materials forming a superlattice structure. By controlling the process parameters, the relative composition of a formed layer that includes multiple deposited materials can also be achieved. The sensors disclosed herein provide an accurate monitoring of film deposition rate and film thickness by measuring concentrations of certain components being deposited, such as small organic molecules.

Controlling the film deposition rate and the rotational speed of the substrate support results in a deposition process that is able to form films with desirable compositions on the surface of the substrate. As such, the resulting films have desired domain sizes and morphologies, solving the problem of resulting films having undesired domain sizes and morphologies that impedes charge separation and extraction in organic electronic devices.

Figure 1:
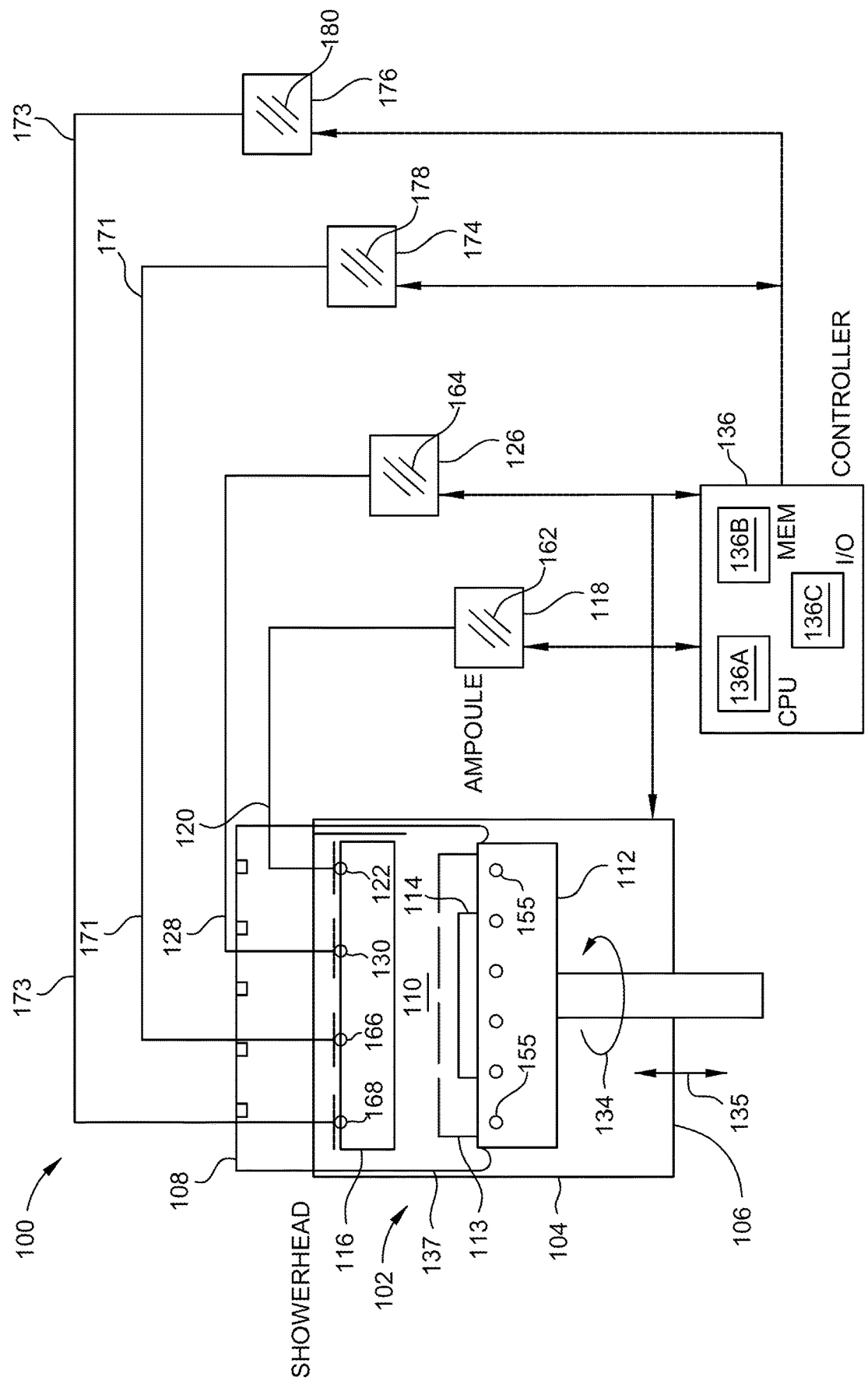
FIG. 1 is schematic view of a process system, in accordance with some embodiments.

FIG. 1 is a schematic view of process system 100 according to at least one embodiment described herein. The process system 100 includes a process chamber 102. The process chamber 102 is defined by side walls 104, a bottom 106, and a chamber lid 108, forming a process volume 110. The process chamber 102 is configured to process a substrate, such as a substrate 114, within the process volume 110 of the process chamber 102. The substrate 114 is supported by a substrate support 112 disposed in the process chamber 102. A mask 113 with openings is positioned above the substrate 114. The mask 113 is positioned such that the materials flow onto separate regions of the substrate 114, forming suitable devices. In some embodiments, the process chamber 102 may be a chemical vapor deposition (CVD) chamber, atomic layer deposition (ALD) chamber, or physical vapor deposition (PVD) chamber configured to perform process material deposition such as organic vapor deposition in accordance with the present disclosure. However, other chambers can also be used and modified with the teachings provided herein.

In some embodiments, a material layer (not shown), or derivatives thereof, may be formed, condensed, or otherwise deposited by a deposition process on the substrate 114 by separately controlling the mass flow rate of each of the materials, which each require different evaporation temperatures. As such, embodiments herein cannot be evaporated through a conventional showerhead. In some embodiments, some of material combinations used can be a CuPc:C60 mix; a CBP:Ir(ppy)$_3$ mix; a distributed Bragg reflector (DBR) superlattice structure (MgF$_2$/SiOx pairs for example), and/or other similar combinations. A showerhead 116 can have one or more segments, such as a first segment 122, a second segment 130, a third segment 166, and a fourth segment 168. Although four segments are shown in FIG. 1, other showerheads can be provided that include any number of segments. Using the multiple segments, the showerhead 116 is configured to deposit multiple process materials to form desirable films on the substrate 114, which is described in more detail below. Other chambers without showerheads 116 are also contemplated in some embodiments.

The chamber lid 108 is positioned above the showerhead 116. As shown in FIG. 1, the process system 100 includes a first ampoule 118, a second ampoule 126, a third ampoule 174, and a fourth ampoule 176. A first material 162 is contained within a process volume of the first ampoule 118, a second material 164 is contained within a process volume of the second ampoule 126, a third material 178 is contained within a process volume of the third ampoule 174, and a fourth material 180 is contained with a process volume of the fourth ampoule 176. The first ampoule 118 delivers the first material 162 to the first segment 122 of the showerhead 116 via a first delivery line 120, the second ampoule 126 delivers the second material 164 to the second segment 130 of the showerhead 116 via a second delivery line 128, the third ampoule 174 delivers the third material 178 to the third segment 166 of the showerhead via a third delivery line 171, and the fourth ampoule 176 delivers the fourth material 180 to the fourth segment 168 of the showerhead 116 via a fourth delivery line 173. Although four ampoules are shown in FIG. 1, other embodiments can include any number of ampoules, each containing its own process material and each delivering the process material to a separate segment of a showerhead (e.g., the showerhead can contain as many separated segments as different materials provided). Additionally, in other embodiments, two opposing segments of the showerhead 116 can connect to the same ampoule to deposit the same material.

In these embodiments, the temperature in the process system 100 is controlled by heating elements contained in different parts of the system, such as along one or more of the delivery lines 120, 128, 171, 173, and/or one or more ampoules 118, 126, 174, 176.

To enable temperature control of the substrate 114, the substrate support 112 includes a plurality of coolant channels 155. The coolant channels 155 are utilized to flow a coolant, such as water, ethylene glycol, or other suitable coolant, therein. Typically, the temperature of the substrate is maintained cold enough such that there is no effect on film composition. Temperatures of the substrate may be maintained at about 0 degrees Celsius to about 70 degrees Celsius.

Controlling the temperature throughout different portions of the process system 100 can be used to control the mass flow rate throughout different portions of the process system 100. When the temperature is increased, it causes an increase in the flow rate of the vaporized material in an open system due to a decrease in density of the vaporized material. When the temperature is decreased, it causes a decrease in flow rate due to an increase in density of the vaporized material. In embodiments described herein, the mass flow rate can be controlled without the use of a carrier gas. However, in other embodiments, carrier gases can be optionally provided. In some embodiments, pressure in the system is maintained at about $10 \text{ E}^{-04}$ Torr (about 0.1333 Pascals) to about $10 \text{ E}^{-10}$ (about $1.333 \text{ E}^{-7}$ Pascals).

In these embodiments, the substrate support 112 is configured to rotate as shown by the arrow 134 in FIG. 1.

Additionally, the substrate support 112 is configured to move vertically as shown by arrow 135. The substrate support 112 is controlled to rotate at a speed such that it achieves desired deposited film results on the surface of the substrate 114.

As discussed above, some parameters that affect the size of the regions formed within the resulting films are the mass flow rate out of the showerhead 116, pressure within the process volume 110, and the rotation rate of the substrate support 112. Some factors that determine the mass flow rate of material out of the showerhead 116 are the temperature in each of the first segment 122, the second segment 130, the third segment 166, and the fourth segment 168 of the showerhead 116, the flow rate of the material delivered to each of the first segment 122, the second segment 130, the third segment 166, and the fourth segment 168 of the showerhead 116, the flow regime within the material delivery components (e.g., molecular flow), the temperature of each of the first ampoule 118, the second ampoule 126, the third ampoule 174, and the fourth ampoule 176, the temperature gradient from each of the ampoules 118, 126, 174, 176 to the showerhead 116, and the pressure of the process chamber 102. Controlling these factors will determine the deposition rate of the material, resulting in films of desirable compositions formed on the surface of the substrate 114.

In some embodiments, each of the above factors can be controlled by a controller 136. The controller 136 is in communication with hardware contained within the entire process system 100, including hardware contained within the process chamber 102. The controller 136 may include a central processing unit (CPU) 136A, memory 136B, and support circuits (or I/O) 136C. The CPU 136A may be one of any form of computer processors that are used in industrial settings for controlling various processes and hardware (e.g., motors, valves, power delivery components, and other related hardware) and monitor the processes (e.g., processing time and substrate position or location). The memory 136B is connected to the CPU 136A, and may be one or more of a readily available memory, such as random access memory (RAM), read only memory (ROM), floppy disk, hard disk, or any other form of digital storage, local or remote. Software instructions, algorithms and data can be coded and stored within the memory 136B for instructing the CPU 136A. The support circuits 136C are also connected to the CPU 136A for supporting the processor in a conventional manner. The support circuits 136C may include conventional cache, power supplies, clock circuits, input/output circuitry, subsystems, and the like. A program (or computer instructions) readable by the controller determines which tasks are performable within the process system 100.

Figure 2:
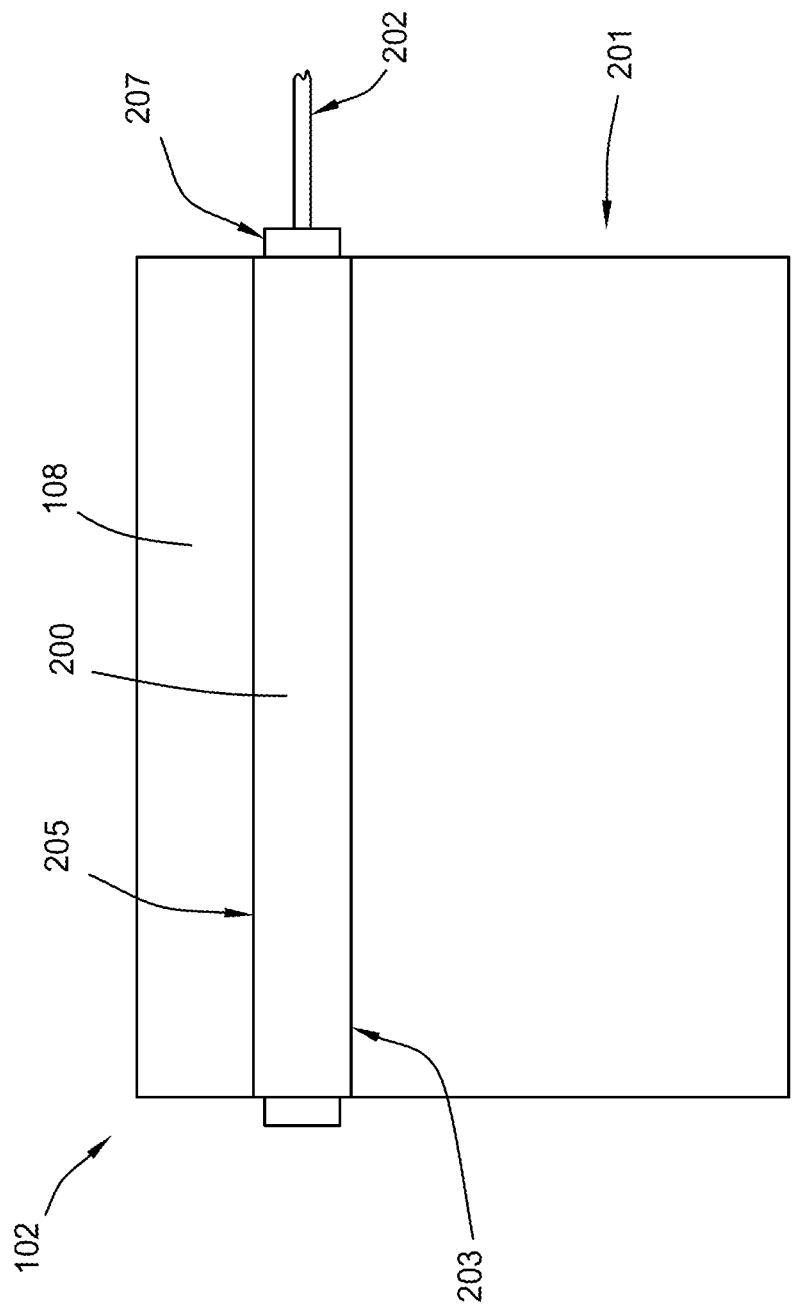
FIG. 2 depicts a side view of a process chamber with a sensor assembly, in accordance with some embodiments.

FIG. 2 depicts a side view of a process chamber 102, in accordance with some embodiments. The process chamber 102 includes a chamber body 201 formed by side wall 104 and bottom 106, a substrate support 112 disposed in a process volume 110 of the chamber body 201. A sensor assembly 200 is coupled to the chamber body 201 at a lower portion 203 of the sensor assembly 200. The sensor assembly 200 is coupled to the lid 108 at an upper portion 205 of the sensor assembly 200. The sensor assembly 200 includes one or more apertures disposed through one or more sides of the sensor assembly. One or more sensors are disposed in the sensor assembly 200 through the one or more of the apertures and are secured by a flange 207. FIG. 2 shows one sensor installed with a sensor connection 202. In some embodiments, the sensor connection 202 includes a cooling tube, such as a water tube to cool the sensor during operation.

Figure 3:
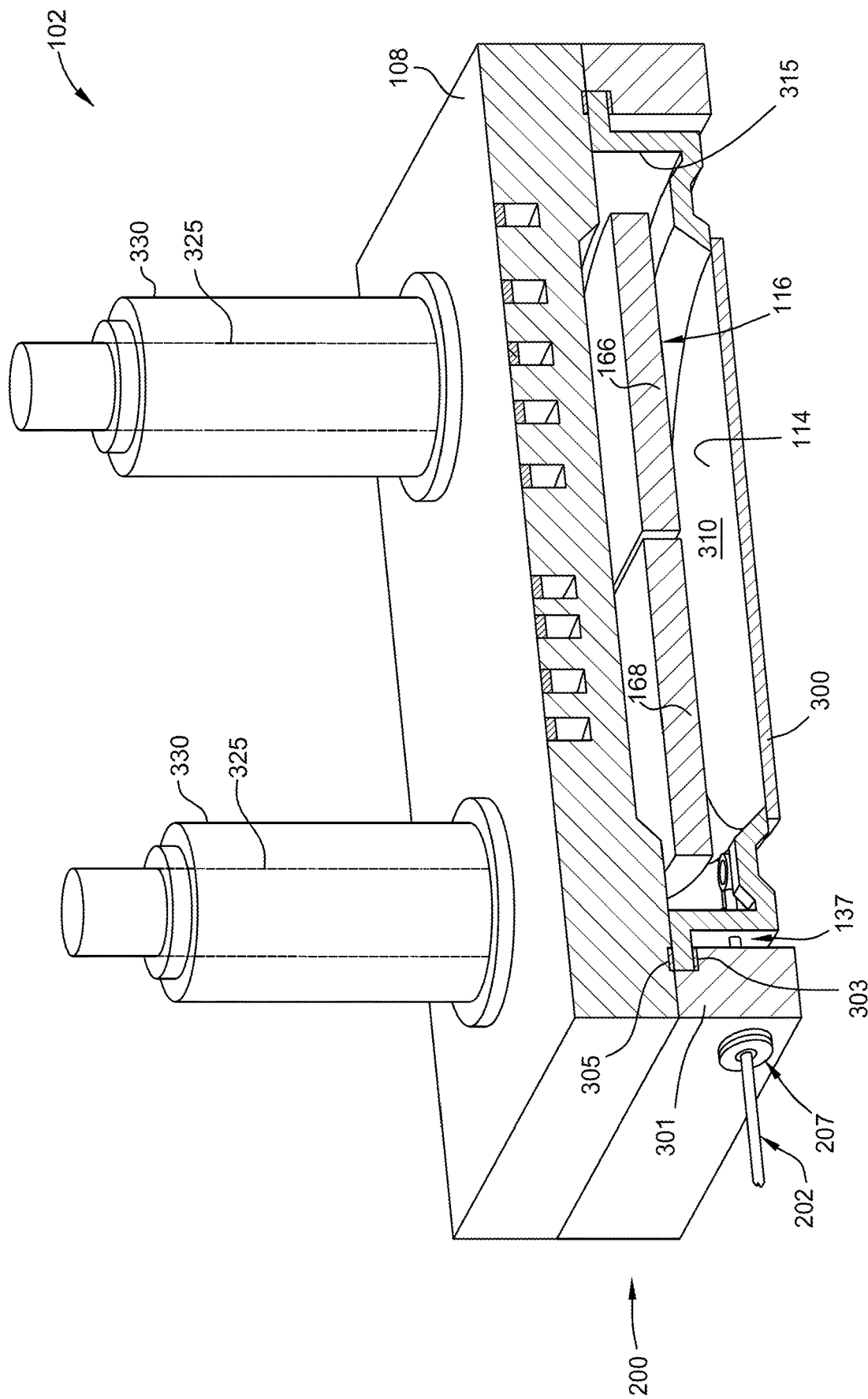
FIG. 3 depicts an isometric view of a process chamber, in accordance with some embodiments.

FIG. 3 is an isometric sectional view of a portion of the process chamber 102 of FIG. 1. The chamber lid 108 is shown above the showerhead 116. The showerhead 116 extends at least partially surrounded by the sensor assembly 200. In some embodiments, the showerhead 116 is disposed entirely surrounded by the sensor assembly 200, such as within a recess of the sensor assembly 200. Showerhead segments 166 and 168 are depicted with corresponding sensors disposed below each segment. In some embodiments, the sensor assembly 200 includes a removable adaptor 301 configured to be stacked over the chamber body 201 and below the lid 108. The sensor assembly 200 further includes a shroud 137 fitted within the adaptor an surrounding the substrate 114. O-rings 303 and 305 can be disposed at interfaces between the adaptor 301 and the shroud 137 and between the adaptor 301 and the lid 108. The process chamber is capable of operating with or without the sensor assembly 200. In some embodiments, the substrate support is slightly raised when the adaptor is installed in order to maintain an operating distance from the showerhead. In some embodiments, a distance between a sensor of the sensor assembly 200 and the showerhead is about 1 cm to about 5 cm, or greater than 5 cm. The distance between the showerhead and the sensor is adjusted by adjusting the thickness of the removable adaptor sensor assembly 200. Alternatively, the distance between the showerhead and the sensor is adjusted by stacking a spacer over the adaptor. In some embodiments, a gap between an inner circumference of the recess and an outer circumference of the showerhead is about 1 cm to about 7 cm.

The substrate 114 is supported on a carrier 300 or directly on the substrate support. The carrier 300 would be supported on the substrate support 112 (not shown). A shadow mask is at least partially overlying the substrate 114. The shadow mask includes a plurality of fine openings that provide a pattern for deposition of films on the substrate 114. In some embodiments, a shadow mask is not used.

The shroud 137 and the substrate 114 are in a processing position in FIG. 3. A process cavity 310 is formed between the showerhead 116, the substrate 114, and walls 315 of the shroud 137. The process cavity 310 confines deposition materials herein and minimizes deposition on chamber components outside of the process cavity 310. The chamber lid 108 includes inlets 325 each surrounded by a heating element 330 that provide vaporized material to the showerhead 116. Although vaporized material is depicted as being supplied from outside of the process chamber, other arrangements are also contemplated, such as providing vaporized material from a source within the process chamber.

Figure 4:
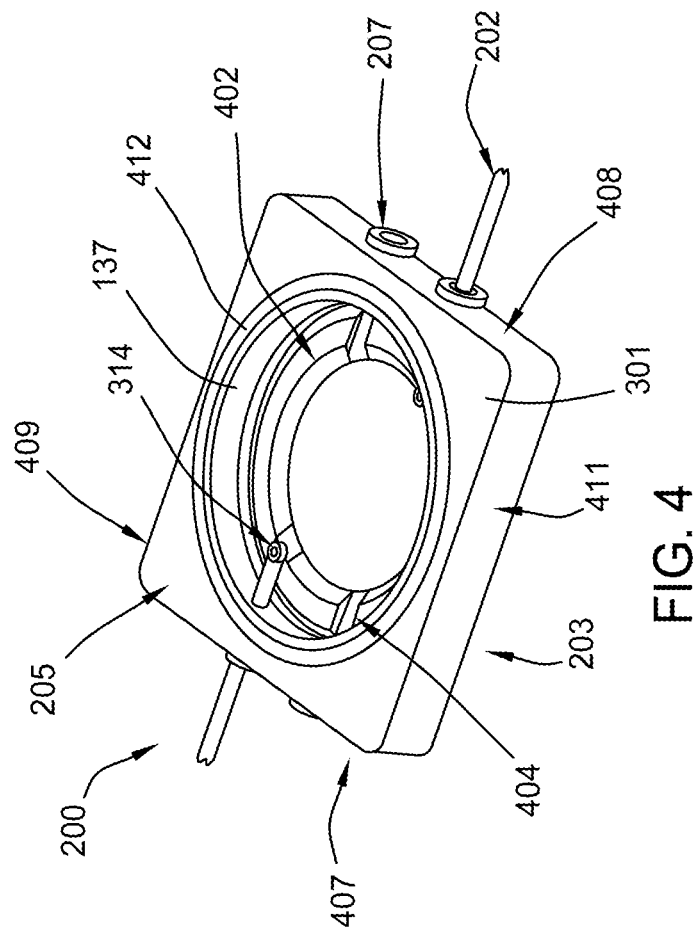
FIG. 4 depicts an isometric view of a sensor assembly, in accordance with some embodiments.

The sensor assembly 200 is described with reference to FIGS. 4-7. FIG. 4 is an isometric view of the sensor assembly 200. The shroud 137 is removably disposed within the adaptor 301 such that a rim 412 of the shroud 137 fits within an annular recess of the adaptor 301. The sensor assembly 200 includes a first major surface 205 and a second major surface 203 opposing the first major surface 205. A shelf 402 is defined by a lower surface of the shroud 137 extending from an inner sidewall surface 315 radially inward. The sensor assembly 200 includes one or more sides (e.g., sides 407, 408, 409, 411). Although four sides are depicted in the Figures, other shapes are also contemplated such as a circular perimeter, or 5 to 8 sides. The shroud 137 includes grooves 404 disposed at certain portions of the shelf 402 and configured to receive sensors 314. In some embodiments, the flange 207 is compression fitted such that the sensor is capable of being positioned at various locations along the groove, such as to evaluate a showerhead profile at various deposition positions along one or more radial paths of the showerhead.

Figure 5:
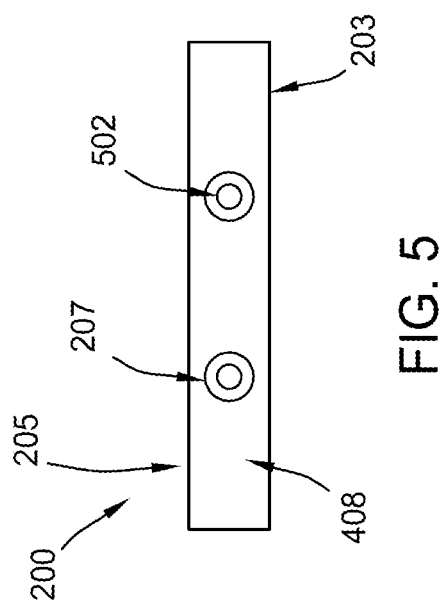
FIG. 5 depicts a side view of a sensor assembly, in accordance with some embodiments.

FIG. 5 is a side view of the sensor assembly from side 408. Each side, including side 408, extends from the first major surface 205 to the second major surface 203. At least one of the sides, such as side 408 includes one or more apertures 502 disposed therethrough. The one or more apertures 502 receive sensors 314 which are secured using fasteners such as flange 207. The apertures 502 align with grooves 404 which are capable of receiving sensors 314. The sensor includes a crystal active area that is about 1 to about 2 cm in diameter. Each sensor is disposed proximate to an edge of the showerhead and near a circumferential midpoint of each showerhead portion. The placement of each sensor reduces blocking material from reaching the substrate. Other placements are also contemplated, such as closer to the middle of the showerhead.

Figure 6:
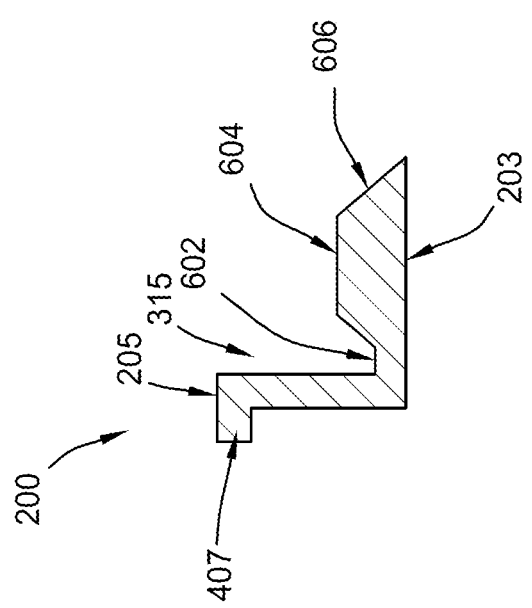
FIG. 6 depicts a cross sectional side view of a shroud of a sensor assembly, in accordance with some embodiments.

FIG. 6 is a cross sectional view of a shroud 137 of the sensor assembly 200 taken at a location without a groove 404. The shelf 402 includes an annular trench 602 concentric and radially inward from the inner surface 315 of the sensor assembly 200. The shelf 402 includes an annular raised portion 604. The annular raised portion 604 is disposed radially inward relative to the annular trench 602. The innermost portion 606 is tapered from the raised portion 604 to the second major surface 203. As can be seen in FIG. 6, portions of the shelf that do not include grooves, have different heights relative to the second major surface 203, such as at the trench 602, raised portion 604, and innermost portion 606. In contrast, as can be seen in FIG. 7, a height of the shelf 402 in portions 704 with grooves 404 is uniform along each of the one or more grooves 404.

Figure 7:
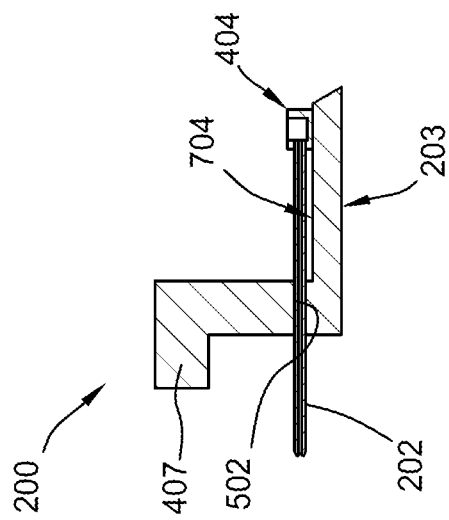
FIG. 7 depicts a cross sectional side view of a groove portion of a shroud of a sensor assembly, in accordance with some embodiments.

FIG. 7 is a cross sectional view of a shroud 137 of the sensor assembly 200 at a location with a groove 404 and depicting aperture 502 aligned with the groove 404. In some embodiments, each groove 404 is substantially aligned with the one or more apertures (e.g., 502). Each of the one or more grooves 404 are configured to receive sensors, such as quartz crystal monitor (QCM) sensors 314. Other sensors are also contemplated.

Figure 8:
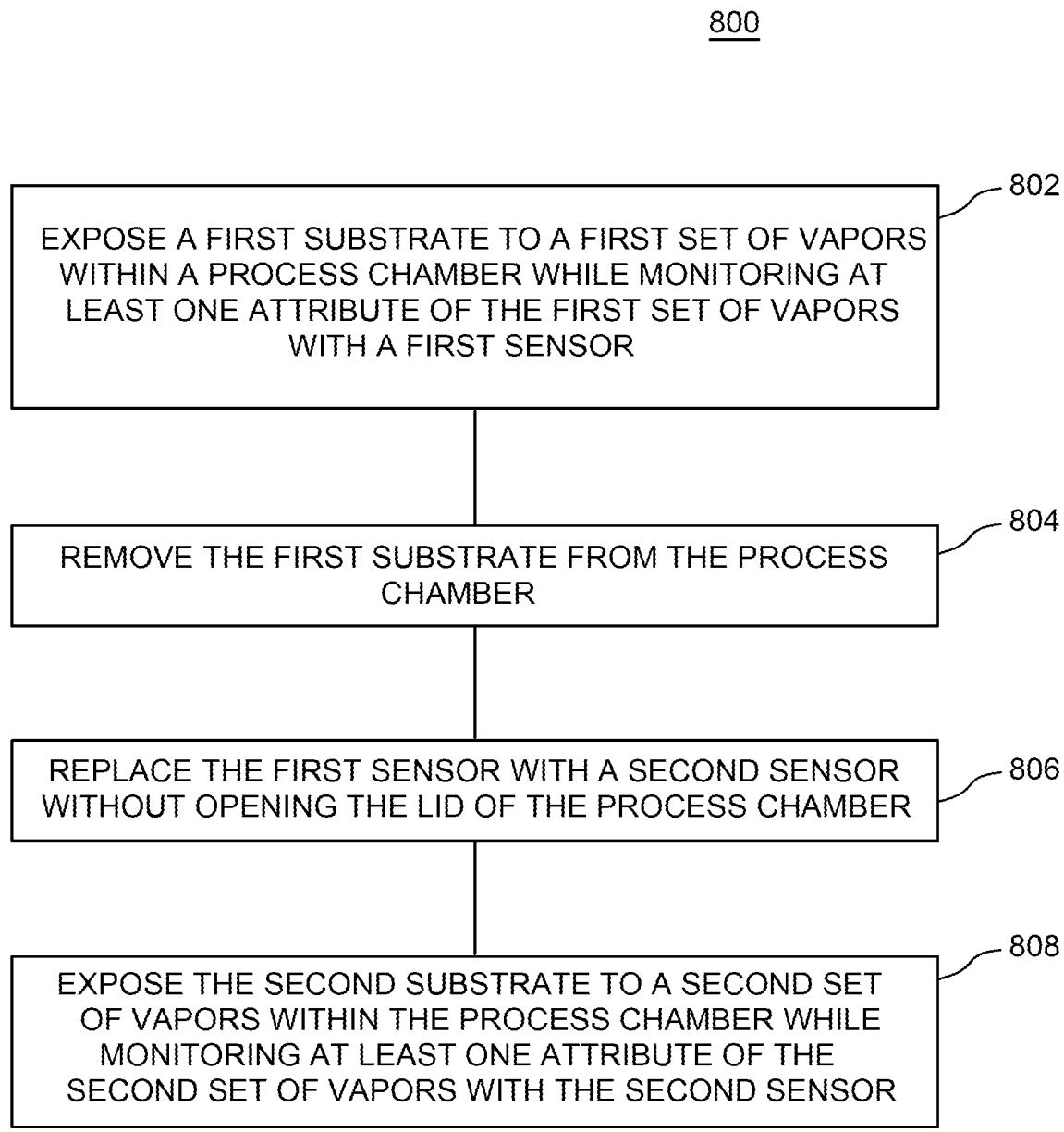
FIG. 8 depicts a flow diagram of replacing one or more sensors of a sensor assembly, in accordance with some embodiments.

FIG. 8 depicts a flow diagram of replacing one or more sensors of a sensor assembly, in accordance with some embodiments. The method 800 includes, at operation 802, exposing a first substrate to a first set of vapors within a process chamber while monitoring at least one attribute of the first set of vapors. The at least one attribute is a concentration of a vapor distributed over the sensor, such as an organic material concentration. The concentration is indicative of a film being deposited over the first substrate, such as a thickness of the first substrate. The first set of vapors can include a mixture of vapors, or individual vapors distributed to different portions of the first substrate. The first set of vapors is distributed through the showerhead disposed above the first substrate.

At operation 804, the first substrate is removed from the process chamber. In some embodiments several substrates are processed after removing the first substrate, such as by cyclically repeating operations 802 and 804.

After removing the first substrate and/or subsequently processed substrates, at operation 806, the first sensor is replaced with a second sensor without opening the lid off of the chamber body. The first sensor is removed by removing a flange from a side of the of the sensor assembly. Prior to removing the flange, the process chamber is vented to raise the pressure of the process chamber. In some implementations, a component from the first sensor is removed and replaced with another component, such as a crystal replacement. The first sensor having replaced component(s) is thus configured as a second sensor. In other implementations, the first sensor is removed and replaced with a second sensor having a different sensing capability or component, as a different crystal. In some implementations, a sensor is positioned through an aperture of the sensor assembly into a recess of the sensor assembly. The sensor is positioned without removing a lid of the process chamber. A flange is attached over the aperture to secure the sensor within the recess of the sensor assembly. It has been discovered that an ability to remove and replace sensors or sensor components without removing the lid enables easy maintenance of sensors such as QCM sensors. Crystals of the QCM sensors are replaced by removing the flange from the side of the sensor assembly, removing the sensor through the aperture of the sensor assembly, replacing the sensor (or component (e.g., crystal) of the sensor), and securing the sensor or replaced sensor back in the sensor assembly, entirely without opening the lid of the process chamber. Thus, chamber down time is greatly reduced. After the flange is replaced, the process chamber is pumped down back to the operating pressure to process a second substrate.

The positioning of the sensors directly below the showerhead enables accurate sensing of a material concentration compared to systems in which sensors are placed along gas lines or disposed in other portions within the chamber. Additionally, placing the sensors directly below the showerhead enables a compact chamber design. Operation 808 includes exposing the second substrate to a second set of vapors within the process chamber while monitoring at least one attribute of the second set of vapors with the second sensor, such as an organic material concentration. In some embodiments, the second set of vapors use the same vapors as the first set of vapors. The sensor is an array of sensors disposed within the substrate assembly. Each sensor faces the showerhead and each sensor is disposed on a common plane relative to one another. The common plane is substantially parallel to the bottom surface of the showerhead.

While the foregoing is directed to implementations of the present disclosure, other and further implementations of the present disclosure may be devised without departing from the basic scope thereof, and the scope thereof is determined by the claims that follow.

What is claimed is:

1. A process chamber comprising:
   a chamber body;
   a substrate support disposed in the chamber body;
   a lid disposed over the chamber body; and
   a sensor assembly coupled to the chamber body at a lower portion of the sensor assembly, the sensor assembly coupled to the lid at an upper portion of the sensor assembly, the sensor assembly further comprising:
      one or more apertures disposed through one or more sides of the sensor assembly;
      one or more sensors disposed in the sensor assembly through the one or more of the apertures; and
      a shelf, the shelf comprising grooves substantially aligned with the one or more apertures and configured to receive each of the one or more sensors.

2. The process chamber of claim 1, wherein the one or more sensors are quartz crystal monitor (QCM) sensors.

3. The process chamber of claim 1, wherein the sensor assembly comprises:
   an adaptor; and
   a shroud disposed within a recess of the adaptor.

4. The process chamber of claim 1 further comprising:
a showerhead coupled to the lid, wherein the showerhead is at least partially disposed within the upper portion of the sensor assembly.

5. The process chamber of claim 4, wherein the showerhead is disposed entirely within a recess defined in the upper portion.

6. The process chamber of claim 5, wherein a gap between an inner circumference of the recess and an outer circumference of the showerhead is about 1 cm to about 7 cm.

7. The process chamber of claim 1, further comprising one or more flanges removably coupled to the one or more apertures and configured to secure the one more sensors within the sensor assembly.

8. The process chamber of claim 1, wherein each of the one or more sensors face a showerhead of the lid.

9. The process chamber of claim 1, wherein a first sensor is positioned on a first side of the one or more sides and a second sensor is positioned on a second side of the one or more sides opposing the first side.

10. The process chamber of claim 1, wherein the grooves are disposed within a top of the shelf and substantially aligned with the one or more apertures of an adaptor, wherein the grooves are configured to receive quartz crystal monitor (QCM) sensors.

11. The process chamber of claim 1, wherein the shelf further comprises an annular trench concentric and radially inward from an inner surface of a shroud.

12. The process chamber of claim 1, wherein the shelf further comprises an annular raised portion, wherein the annular raised portion is disposed radially inward relative to an annular trench.

13. The process chamber of claim 1, wherein the shelf is tapered inward from an annular raised portion to an innermost radius of the shelf, wherein the shelf is configured to support the one or more sensors.

14. The process chamber of claim 1, wherein a thickness of the shelf is uniform along each of the grooves.

15. A method for processing a substrate comprising:
exposing a first substrate to a first set of vapors within a process chamber while monitoring at least one attribute of the first set of vapors with a first sensor disposed in a sensor assembly, the sensor assembly disposed between a lid and chamber body and circumscribing a showerhead;
removing the first substrate from the process chamber;
replacing the first sensor with a second sensor without opening the lid of the process chamber; and
exposing a second substrate to a second set of vapors within the process chamber while monitoring at least one attribute of the second set of vapors with the second sensor disposed in the sensor assembly, wherein the sensor assembly is coupled to the chamber body at a lower portion of the sensor assembly, the sensor assembly coupled to the lid at an upper portion of the sensor assembly, the sensor assembly further comprising:
one or more apertures disposed through one or more sides of the sensor assembly, wherein the first sensor is disposed in the sensor assembly through the one or more of the apertures; and
a shelf, the shelf comprising grooves substantially aligned with the one or more apertures and configured to receive the first sensor and second sensor.

16. The method of claim 15, wherein replacing the first sensor with the second sensor without opening the process chamber further comprises:
venting the process chamber prior to removing the first sensor from the sensor assembly; and
pumping down the process chamber after replacing the first sensor with the second sensor.

17. The method of claim 15, further comprising determining a film thickness deposited on the first substrate based on the first sensor.

18. The method of claim 15, wherein the at least one attribute is a material concentration, wherein replacing the first sensor with the second sensor comprises replacing only a first crystal with a second crystal.

* * * * *